United States Patent
Hatsuda

(10) Patent No.: US 9,330,732 B2
(45) Date of Patent: May 3, 2016

(54) SEMICONDUCTOR MEMORY DEVICE

(71) Applicant: KABUSHIKI KAISHA TOSHIBA, Minato-ku, Tokyo (JP)

(72) Inventor: Kosuke Hatsuda, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/458,832

(22) Filed: Aug. 13, 2014

(65) Prior Publication Data

US 2015/0262626 A1 Sep. 17, 2015

Related U.S. Application Data

(60) Provisional application No. 61/951,949, filed on Mar. 12, 2014.

(51) Int. Cl.
| | |
|---|---|
| G11C 5/06 | (2006.01) |
| G11C 5/10 | (2006.01) |
| G11C 11/16 | (2006.01) |
| G11C 5/02 | (2006.01) |
| G11C 13/00 | (2006.01) |

(52) U.S. Cl.
CPC *G11C 5/10* (2013.01); *G11C 5/025* (2013.01); *G11C 11/16* (2013.01); *G11C 11/1655* (2013.01); *G11C 11/1673* (2013.01); *G11C 13/004* (2013.01); *G11C 13/0023* (2013.01); *G11C 13/0026* (2013.01); *G11C 2013/0054* (2013.01); *G11C 2213/79* (2013.01); *G11C 2213/82* (2013.01)

(58) Field of Classification Search
CPC .............. G11C 11/405; G11C 11/4076; G11C 11/5607; G11C 13/004; G11C 15/02; G11C 15/046; G11C 2013/0054; G11C 2211/4016; G11C 8/04; G11C 8/12; G11C 13/0026; G11C 13/0061; G11C 2013/0045
USPC ............. 365/148, 158, 189.011, 230.03, 163, 365/189.15, 210.1, 189.16, 207, 72
See application file for complete search history.

(56) References Cited

U.S. PATENT DOCUMENTS

| | | |
|---|---|---|
| 2010/0002492 A1 | 1/2010 | Kajiyama |
| 2013/0242641 A1 | 9/2013 | Nakai |
| 2014/0286081 A1* | 9/2014 | Takahashi ............ G11C 13/004 365/148 |

FOREIGN PATENT DOCUMENTS

JP 2007164837 A 6/2007

* cited by examiner

*Primary Examiner* — Thong Q Le
(74) *Attorney, Agent, or Firm* — Holtz, Holtz & Volek PC

(57) ABSTRACT

According to one embodiment, a semiconductor memory device includes a first bit line extending in a first direction, a first source line including a first portion that extends in the first direction, a second portion that extends in the first direction, and a third portion that connects one end of the first portion and one end of the second portion, a first memory cell having one terminal electrically connected to the first bit line and the other terminal electrically connected to the first portion of the first source line, a first sense amplifier arranged on the other end side of the first portion and the second portion of the first source line, and a first current sink arranged on a side of the first sense amplifier with respect to the first bit line and the first source line.

20 Claims, 11 Drawing Sheets

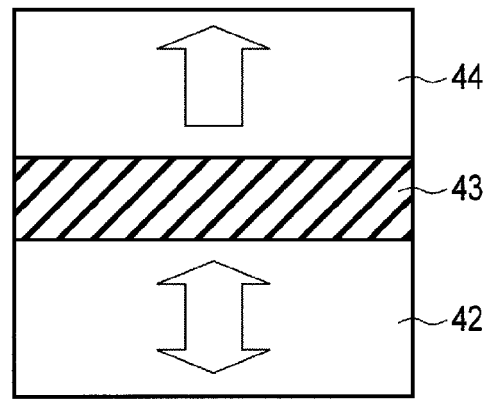
F I G. 2A
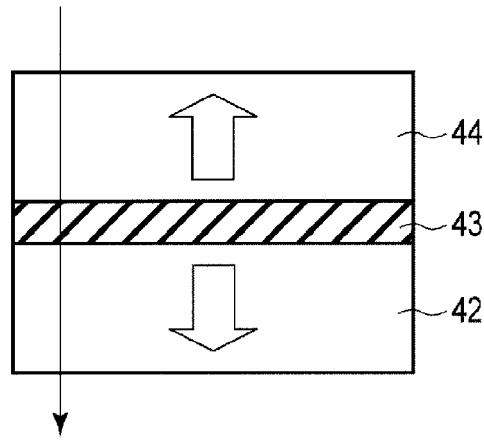
Write current
F I G. 2B    Parallel state (low resistance)
Write current
F I G. 2C    Antiparallel state (high resistance)

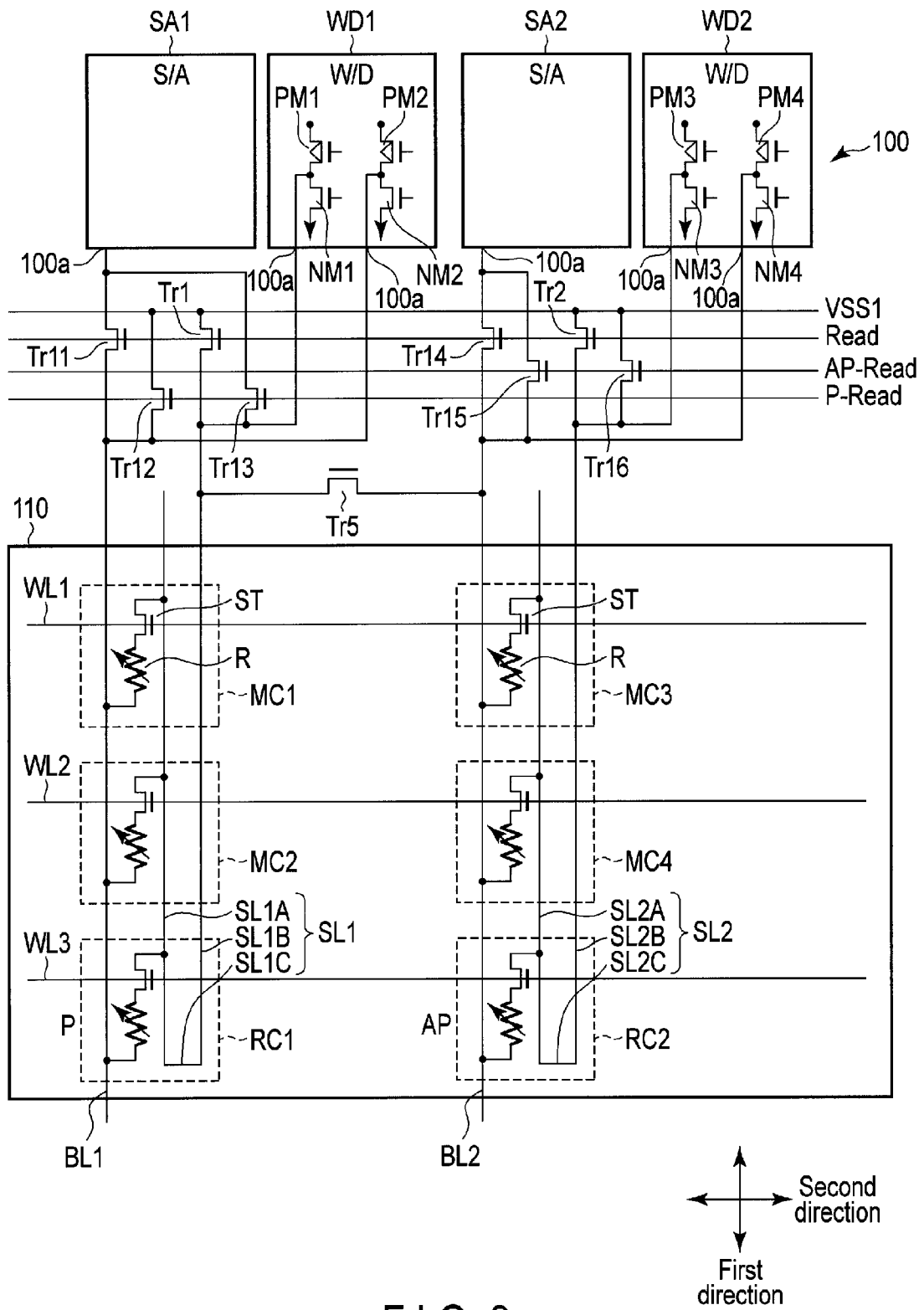
F I G. 3

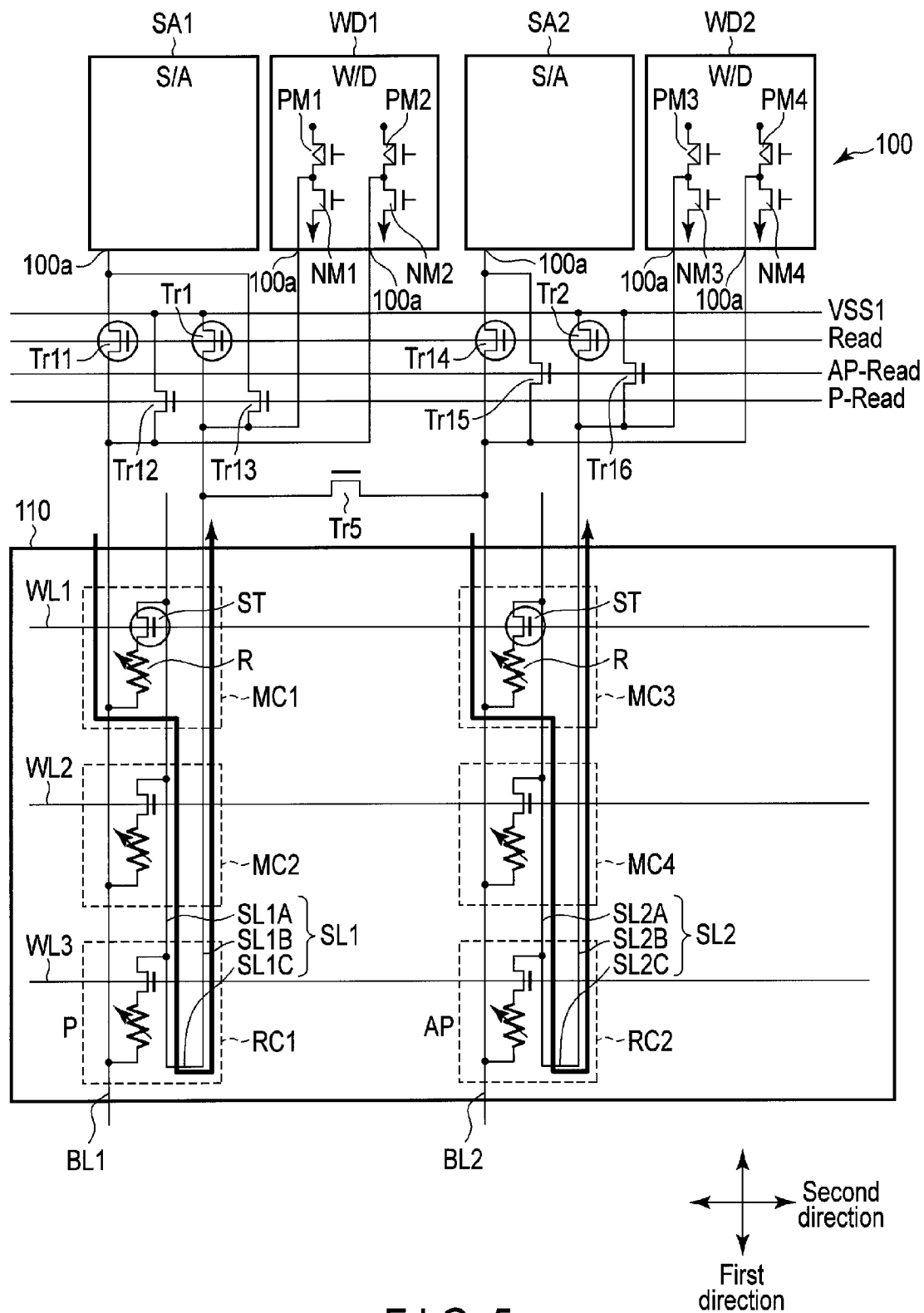
F I G. 5

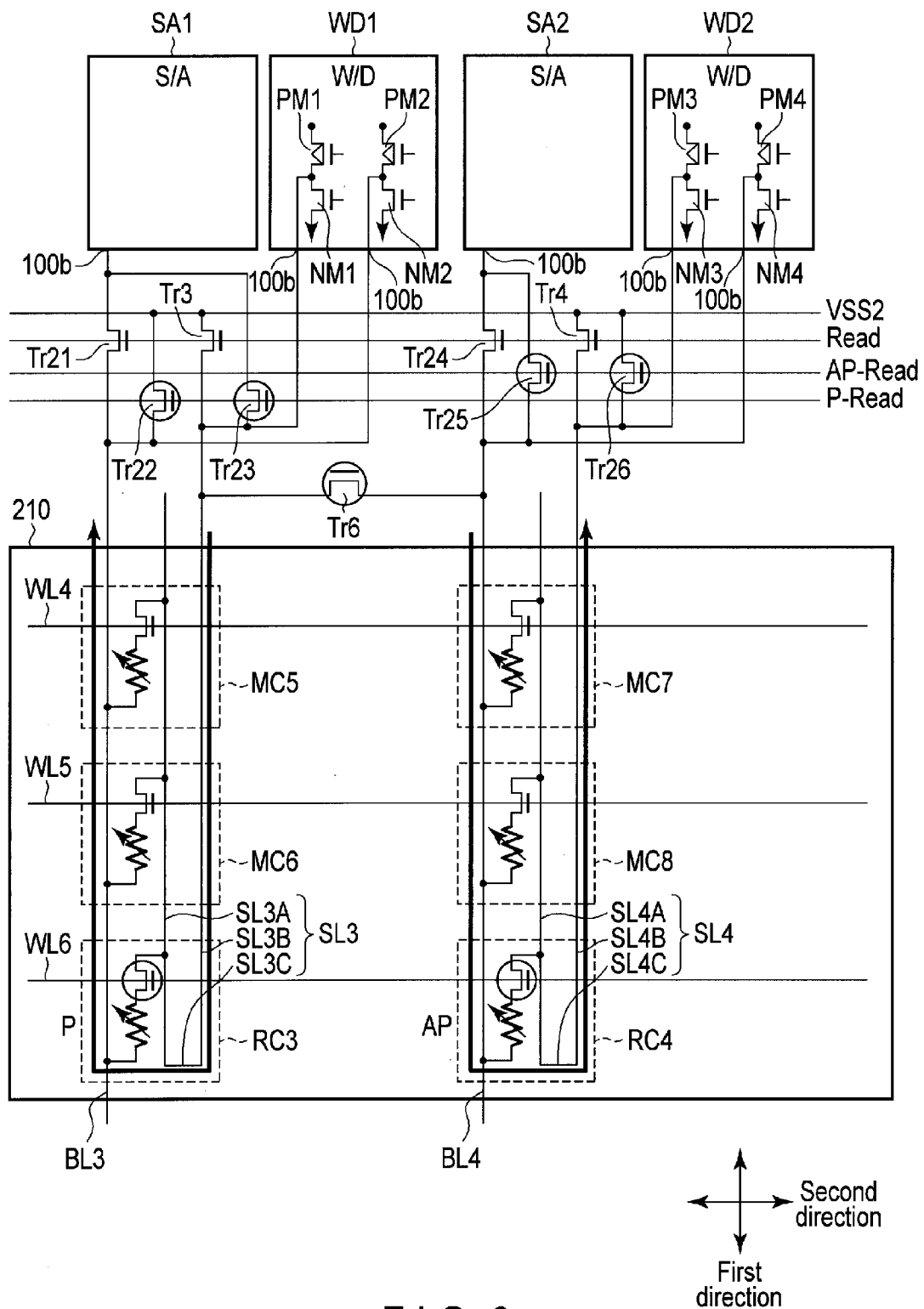
F I G. 6

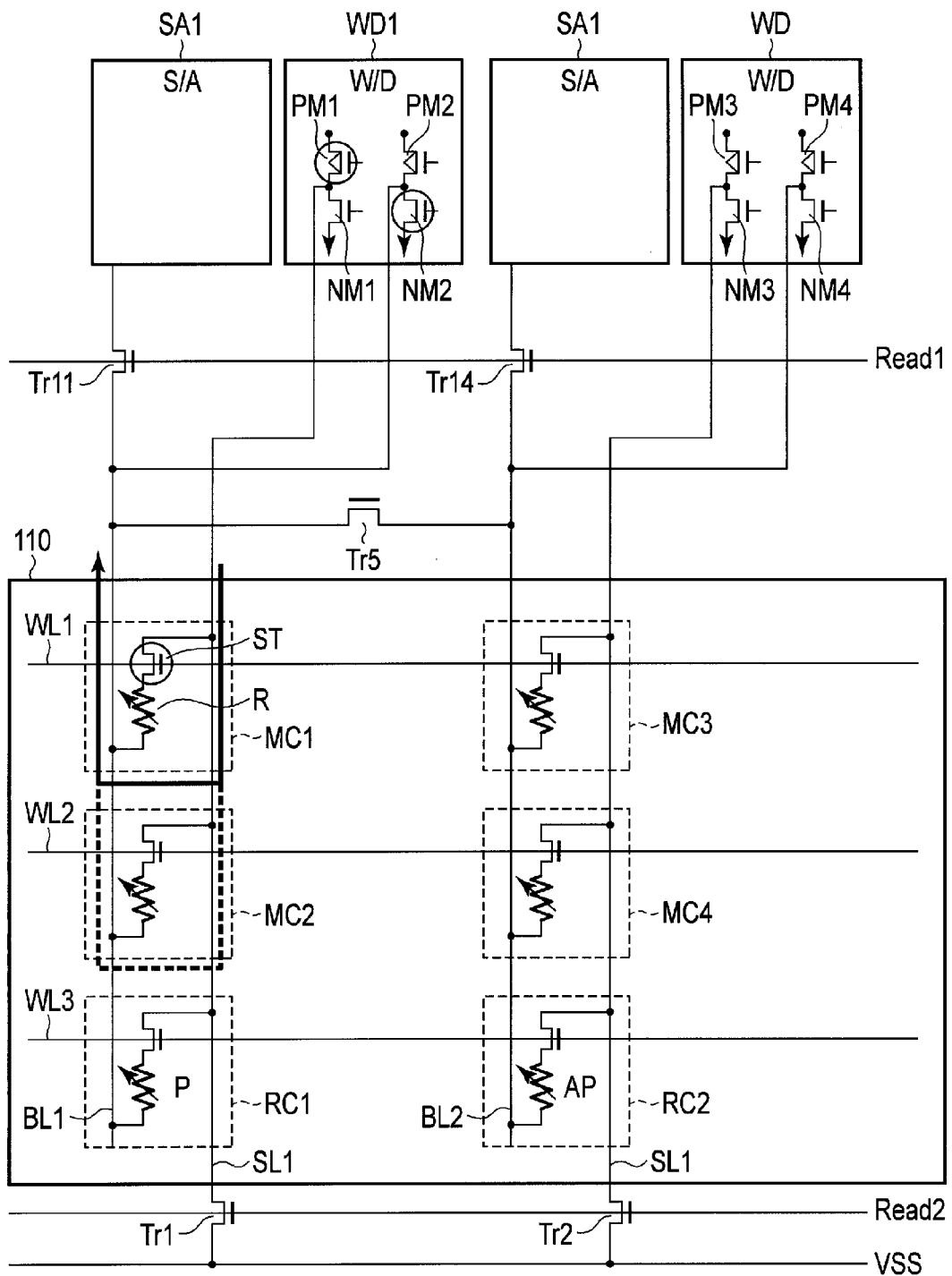
F I G. 7

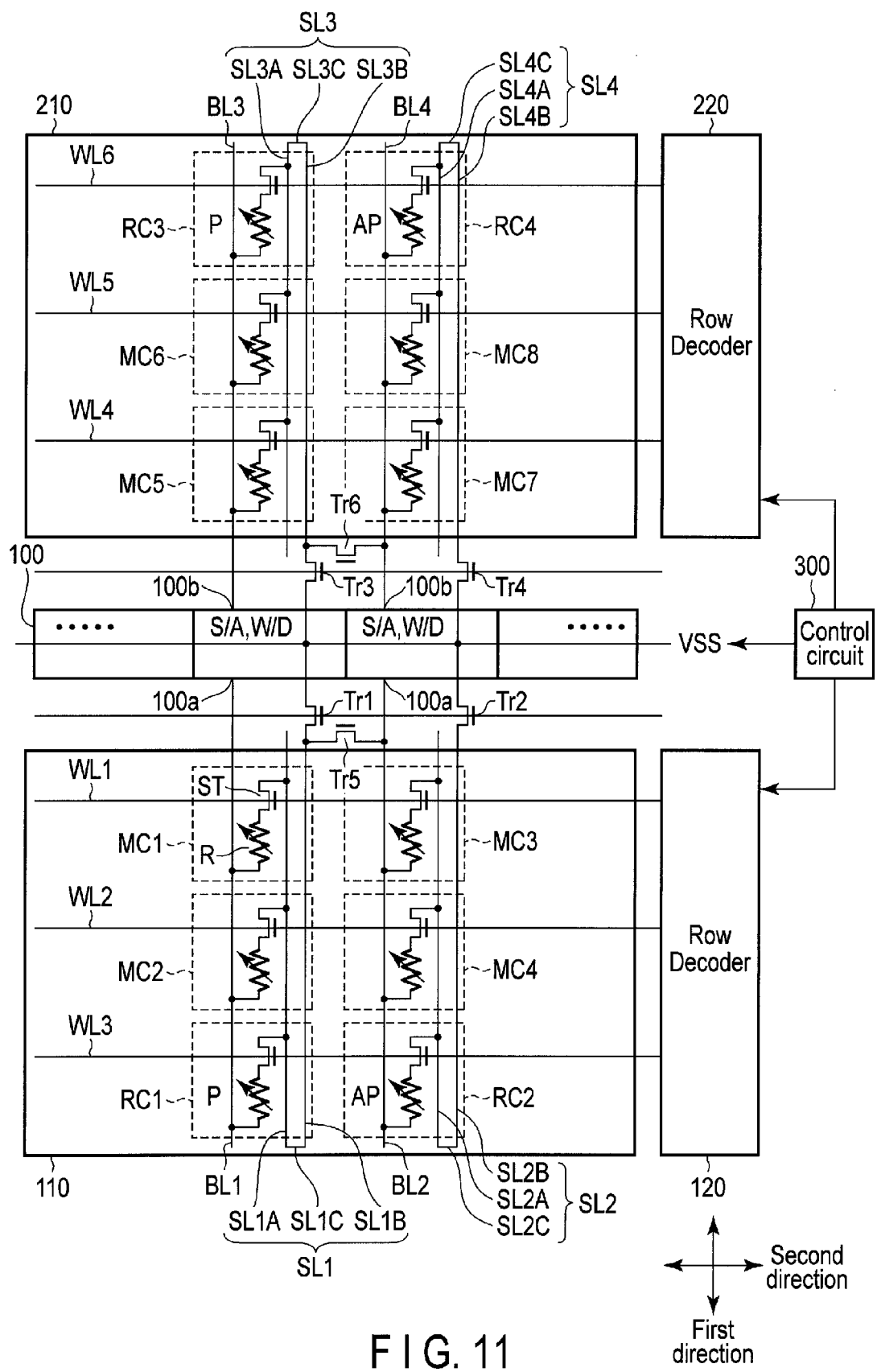
F I G. 11

SEMICONDUCTOR MEMORY DEVICE

CROSS REFERENCE TO RELATED APPLICATIONS

This application is based upon and claims the benefit of priority from U.S. Provisional Application No. 61/951,949, filed Mar. 12, 2014, the entire contents of all of which are incorporated herein by reference.

FIELD

Embodiments described herein relate generally to a semiconductor memory device.

BACKGROUND

An MRAM (Magnetic Random Access Memory) is a memory device using a memory element having a magnetoresistive effect in a memory cell configured to store information. The MRAM has received attention as a next-generation memory device that features a high-speed operation, large capacity, and nonvolatility.

BRIEF DESCRIPTION OF THE DRAWINGS

FIG. 2A is a sectional view showing the schematic arrangement of a magnetoresistive element;

FIG. 2B is a sectional view showing the magnetoresistive element in a parallel state so as to explain the write operation of the magnetoresistive element;

FIG. 2C is a sectional view showing the magnetoresistive element in an antiparallel state so as to explain the write operation of the magnetoresistive element;

FIG. 3 is a circuit diagram showing part of FIG. 1 in more detail;

FIG. 5 is a circuit diagram showing memory cells in the read operation of the semiconductor memory device according to the first embodiment;

FIG. 6 is a circuit diagram showing reference cells in the read operation of the semiconductor memory device according to the first embodiment;

FIG. 7 is a circuit diagram showing the write operation of a semiconductor memory device according to a comparative example;

FIG. 11 is a circuit diagram showing the arrangement of a semiconductor memory device according to the third embodiment.

DETAILED DESCRIPTION

Figure 1:
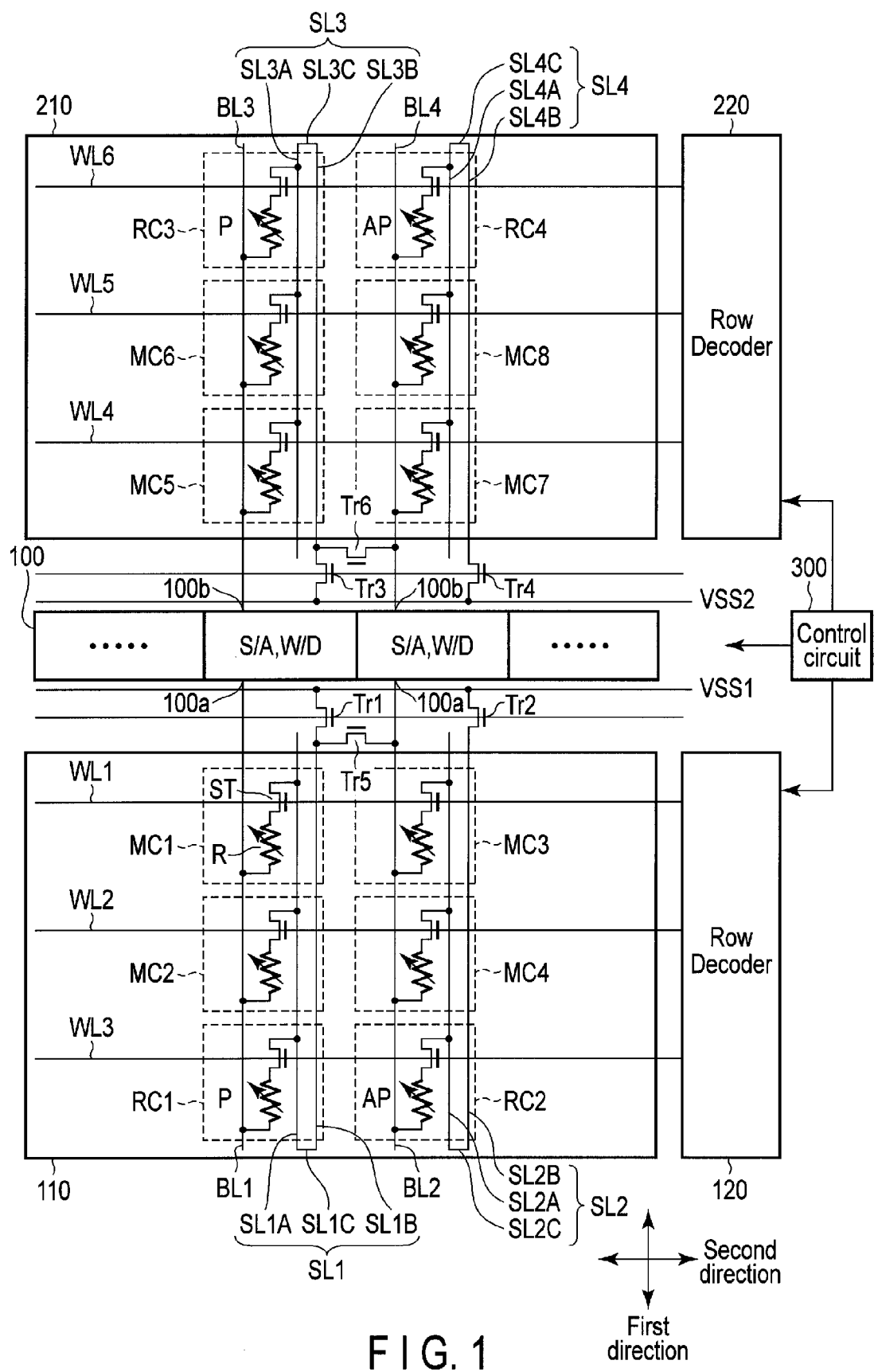
FIG. 1 is a circuit diagram showing the arrangement of a semiconductor memory device according to the first embodiment.

To perform read/write of a magnetoresistive element of an MRAM or the like, normally, bit lines and source lines are arranged. The current sink (a portion connected to a GND line) of a read current path in a read operation is usually arranged at an end of a source line on a side opposite to the side of a sense amplifier (a circuit including a read current source (power supply) in this case) and the side of a write driver so as to eliminate the dependence of the resistance of the read current path on the position of a read target cell.

Hence, the control lines of the sense amplifier and the write driver are spaced apart from the control line of the current sink. This may lead to a dispersion of control circuits and an increase in the circuit area.

Additionally, the above arrangement may cause a read disturb in which reference cell data is rewritten by a read current in the read operation.

Furthermore, in the above arrangement, a write current path (resistance) in a write operation changes depending on the position of a write target memory cell. When the write current path depends on the position of the write target memory cell, write current control according to the write target memory cell is difficult.

In general, according to one embodiment, a semiconductor memory device includes a first bit line extending in a first direction, a first source line including a first portion that is adjacent to the first bit line and extends in the first direction, a second portion that is adjacent to the first portion and extends in the first direction, and a third portion that connects one end of the first portion and one end of the second portion, a first word line that extends in a second direction crossing with the first direction and is crossing with the first bit line and the first source line, a first memory cell formed from a variable resistive element and a select transistor having a gate electrically connected to the first word line and having one terminal electrically connected to the first bit line and the other terminal electrically connected to the first portion of the first source line, a first sense amplifier arranged on the other end side of the first portion and the second portion of the first source line, and a first current sink arranged on a side of the first sense amplifier with respect to the first bit line and the first source line, wherein in a read operation, one end of the first bit line is electrically connected to a first input terminal of the first sense amplifier, and the other end of the second portion of the first source line is electrically connected to the first current sink.

The embodiments will now be described with reference to the accompanying drawings. The same reference numerals denote the same parts throughout the drawings. A repetitive description will be given as needed.

First Embodiment

A semiconductor memory device according to the first embodiment will now be described with reference to FIGS. 1, 2A, 2B, 2C, 3, 4, 5, 6, 7, and 8. In the first embodiment, a source line SL has a U shape formed from a first portion SLA and a second portion SLB which extend in the first direction, and a third portion SLC that connects the one-end sides of them. With this arrangement, a current sink (control line VSS) in a read current path can be arranged on the side of a read/write circuit 100. It is therefore possible to reduce the circuit area, avoid a read disturb of a reference cell RC in a read operation, and implement elimination of the dependence of a write current path in a write operation on the position of a memory cell MC. The first embodiment will be described below in detail.

[Arrangement of First Embodiment]

The arrangement of the semiconductor memory device according to the first embodiment will be described with reference to FIGS. 1, 2A, 2B, 2C, and 3. Although an MRAM that stores data using a magnetoresistive element (MTJ element) will be exemplified here, the semiconductor memory device is not limited to this. This embodiment is applicable to any memory that converts a resistance difference into a current difference or voltage difference and senses it.

FIG. 1 is a circuit diagram showing the arrangement of the semiconductor memory device according to the first embodiment.

As shown in FIG. 1, the semiconductor memory device includes a first memory cell array 110, a first row decoder 120, a second memory cell array 210, a second row decoder 220, the read/write circuit 100, and a control circuit 300.

The first memory cell array 110 and the first row decoder 120 are adjacently provided on one side (the side of a first input terminal 100a) of the read/write circuit 100 in the first direction.

Bit lines BL1 and BL2, source lines SL1 and SL2, word lines WL1 to WL3, memory cells MC1 to MC4, and reference cells RC1 and RC2 are arranged in the first memory cell array 110. The above elements will simply be referred to as bit lines BL, source lines SL, word lines WL, memory cells MC, and reference cells RC in the following explanation when they need not particularly be discriminated. First portions SL1A to SL4A, second portions SL1B to SL4B, and third portions SL1C to SL4C (to be described later) will also be referred to as first portions SLA, second portions SLB, and third portions SLC when they need not particularly be discriminated.

The bit line BL1 extends in the first direction. One end of the bit line BL1 is electrically connected to the first input terminal 100a of the read/write circuit 100.

The source line SL1 includes the first portion SL1A, the second portion SL1B, and the third portion SL1C. The first portion SL1A extends in the first direction and is adjacent to the bit line BL1 in the second direction crossing with the first direction. The second portion SL1B extends in the first direction and is adjacent to the first portion SL1A in the second direction. The third portion SL1C connects one end of the first portion SL1A on the side far from the read/write circuit 100 and one end of the second portion SL1B located on the side of the one end of the first portion SL1A. In other words, the third portion SL1C connects the end of the first portion SL1A and the end of the second portion SL1B on the side opposite to the read/write circuit 100. Hence, the source line SL1 has a U shape with a connection portion (folded portion) on the side opposite to the read/write circuit 100. The other end of the second portion SL1B of the source line SL1 is electrically connected to a control line VSS1 (ground potential) via the current path of a transistor Tr1.

The control line VSS1 is arranged between the read/write circuit 100 and the first memory cell array 110. In other words, the control line VSS1 is arranged on the side of the read/write circuit 100 with respect to the source line SL1 and the bit line BL1. The control line VSS1 is the terminating portion of a current in the read operation of the first memory cell array 110, and is also called a current sink.

The bit line BL2 extends in the first direction and is adjacent to the second portion SL1B of the source line SL1 in the second direction. One end of the bit line BL2 is electrically connected to the first input terminal 100a of the read/write circuit 100. Note that the first input terminal 100a of the read/write circuit 100 to which the bit line BL2 is electrically connected is the first input terminal 100a of the read/write circuit 100 different from the read/write circuit 100 to which the bit line BL1 is electrically connected, as will be described later with reference to FIG. 3.

The source line SL2 includes the first portion SL2A, the second portion SL2B, and the third portion SL2C. The first portion SL2A extends in the first direction and is adjacent to the bit line BL2 in the second direction crossing with the first direction. The second portion SL2B extends in the first direction and is adjacent to the first portion SL2A in the second direction. The third portion SL2C connects one end of the first portion SL2A on the side far from the read/write circuit 100 and one end of the second portion SL2B located on the side of the one end of the first portion SL2A. In other words, the third portion SL2C connects the end of the first portion SL2A and the end of the second portion SL2B on the side opposite to the read/write circuit 100. Hence, the source line SL2 has a U shape with a connection portion on the side opposite to the read/write circuit 100. The other end of the second portion SL2B of the source line SL2 is electrically connected to the control line VSS1 (ground potential) via the current path of a transistor Tr2.

Note that although not illustrated in FIG. 1, one end of the bit line BL can be electrically connected to the control line VSS1, and the other end of the second portion SLB of the source line SL can be electrically connected to the first input terminal 100a of the read/write circuit 100. Details of the connection between the read/write circuit 100, the bit lines BL, and the source lines SL will be described later with reference to FIG. 3.

As described above, the bit lines BL1 and BL2 and the source lines SL1 and SL2 extend in the first direction and are adjacent alternately along the second direction. In other words, the bit line BL1, the source line SL1, the bit line BL2, and the source line SL2 are sequentially arranged along the second direction.

The bit line BL2 and the second portion SL1B of the source line SL1 are electrically connected via the current path of a transistor Tr5. In other words, one terminal of the transistor Tr5 is electrically connected to the bit line BL2, and the other terminal is electrically connected to the second portion SL1B of the source line SL1.

The word lines WL1 to WL3 extend in the second direction and are crossing with the bit lines BL1 and BL2 and the source lines SL1 and SL2. The word lines WL1 to WL3 are adjacent along the first direction.

Each of the memory cells MC1 to MC4 is formed from a variable resistive element R and a switch element (select transistor) ST. A magnetoresistive element is used here as the variable resistive element R.

The memory cell MC1 is arranged between the bit line BL1 and the first portion SL1A of the source line SL1. More specifically, one terminal of the variable resistive element R of the memory cell MC1 is electrically connected to the bit line BL1, and the other terminal is electrically connected to one end of the current path of the select transistor ST. The other end of the current path of the select transistor ST of the memory cell MC1 is electrically connected to the first portion SL1A of the source line SL1. The gate of the select transistor ST of the memory cell MC1 is electrically connected to the word line WL1.

The memory cell MC2 is arranged between the bit line BL1 and the first portion SL1A of the source line SL1. More specifically, one terminal of the variable resistive element R of the memory cell MC2 is electrically connected to the bit line BL1, and the other terminal is electrically connected to one end of the current path of the select transistor ST. The other end of the current path of the select transistor ST of the memory cell MC2 is electrically connected to the first portion SL1A of the source line SL1. The gate of the select transistor ST of the memory cell MC2 is electrically connected to the word line WL2.

The memory cell MC3 is arranged between the bit line BL2 and the first portion SL2A of the source line SL2. More specifically, one terminal of the variable resistive element R of the memory cell MC3 is electrically connected to the bit line BL2, and the other terminal is electrically connected to one end of the current path of the select transistor ST. The other end of the current path of the select transistor ST of the memory cell MC3 is electrically connected to the first portion SL2A of the source line SL2. The gate of the select transistor ST of the memory cell MC3 is electrically connected to the word line WL1.

The memory cell MC4 is arranged between the bit line BL2 and the first portion SL2A of the source line SL2. More specifically, one terminal of the variable resistive element R of the memory cell MC4 is electrically connected to the bit line BL2, and the other terminal is electrically connected to one end of the current path of the select transistor ST. The other end of the current path of the select transistor ST of the memory cell MC4 is electrically connected to the first portion SL2A of the source line SL2. The gate of the select transistor ST of the memory cell MC4 is electrically connected to the word line WL2.

Each of the reference cells RC1 and RC2 has the same arrangement as the memory cell MC. That is, each of the reference cells RC1 and RC2 is formed from the variable resistive element R and the switch element (select transistor) ST.

The reference cell RC1 is arranged between the bit line BL1 and the first portion SL1A of the source line SL1. More specifically, one terminal of the variable resistive element R of the reference cell RC1 is electrically connected to the bit line BL1, and the other terminal is electrically connected to one end of the current path of the select transistor ST. The other end of the current path of the select transistor ST of the reference cell RC1 is electrically connected to the first portion SL1A of the source line SL1. The gate of the select transistor ST of the reference cell RC1 is electrically connected to the word line WL3. Parallel state (P state) data ("0" data) is written in the reference cell RC1.

The reference cell RC2 is arranged between the bit line BL2 and the first portion SL2A of the source line SL2. More specifically, one terminal of the variable resistive element R of the reference cell RC2 is electrically connected to the bit line BL2, and the other terminal is electrically connected to one end of the current path of the select transistor ST. The other end of the current path of the select transistor ST of the reference cell RC2 is electrically connected to the first portion SL2A of the source line SL2. The gate of the select transistor ST of the reference cell RC2 is electrically connected to the word line WL3. Antiparallel state (AP state) data ("1" data) is written in the reference cell RC2.

The word line WL3 is electrically connected to the reference cells RC and therefore functions as a reference word line.

The read/write circuit 100 includes a sense amplifier SA and a write driver WD (to be described later). At the time of a read/write operation, the read/write circuit 100 applies a voltage to the bit line BL and the source line SL via the first input terminal 100a under the control of the control circuit 300.

At the time of a read/write operation, the first row decoder 120 applies a voltage to the word line WL under the control of the control circuit 300.

The second memory cell array 210 and the second row decoder 220 are adjacently provided on the other side (the side of a second input terminal 100b) of the read/write circuit 100 in the first direction. The arrangements of the second memory cell array 210 and the second row decoder 220 are the same as those of the first memory cell array 110 and the first row decoder 120, and a description thereof will be omitted here.

Note that bit lines BL3 and BL4, source lines SL3 and SL4 (first portions SL3A and SL4A, second portions SL3B and SL4B, and third portions SL3C and SL4C), word lines WL4 to WL6, memory cells MC5 to MC8, and reference cells RC3 and RC4, a control line VSS2, and transistors Tr3, Tr4, and Tr6 on the side of the second memory cell array 210 and the second row decoder 220 correspond to the bit lines BL1 and BL2, the source lines SL1 and SL2 (first portions SL1A and SL2A, second portions SL1B and SL2B, and third portions SL1C and SL2C), the word lines WL1 to WL3, the memory cells MC1 to MC4, the reference cells RC1 and RC2, the control line VSS1, and the transistors Tr1, Tr2, and Try on the first memory cell array 110 and the first row decoder 120, respectively.

FIG. 2A is a sectional view showing the schematic arrangement of the variable resistive element (magnetoresistive element) R. As the variable resistive element R, a storage layer 42, a tunnel barrier layer 43, and a reference layer 44 are mainly illustrated here.

As shown in FIG. 2A, the variable resistive element R includes a stacked body formed from the storage layer 42 that is a ferromagnetic layer, the reference layer 44 that is a ferromagnetic layer, and the tunnel barrier layer 43 that is a nonmagnetic layer formed between them.

The storage layer 42 is a ferromagnetic layer having a variable magnetization direction, and has a perpendicular magnetic anisotropy perpendicular or almost perpendicular to the film surface (upper surface/lower surface). "Variable magnetization direction" means that the magnetization direction changes for a predetermined write current. "Almost perpendicular" means that the direction of a residual magnetization falls within the range of $45°<\theta\leq90°$ with respect to the film surface.

The tunnel barrier layer 43 is formed on the storage layer 42. The tunnel barrier layer 43 is a nonmagnetic layer and made of, for example, MgO.

The reference layer 44 is formed on the tunnel barrier layer 43. The reference layer 44 is a ferromagnetic layer having an unchangeable magnetization direction, and has a perpendicular magnetic anisotropy perpendicular or almost perpendicular to the film surface. "Unchangeable magnetization direction" means that the magnetization direction does not change for a predetermined write current. That is, the magnetization direction inverting energy barrier of the reference layer 44 is larger than that of the storage layer 42.

FIG. 2B is a sectional view showing the magnetoresistive element in the parallel state (P state) so as to explain the write operation of the magnetoresistive element. FIG. 2C is a sectional view showing the magnetoresistive element in the antiparallel state (AP state) so as to explain the write operation of the magnetoresistive element.

The variable resistive element R is, for example, a spin transfer torque magnetoresistive element. Hence, when writing data in the variable resistive element R or when reading data from the variable resistive element R, a current is bidirectionally supplied to the variable resistive element R in a direction perpendicular to the film surface.

More specifically, data is written in the variable resistive element R in the following way.

As shown in FIG. 2B, when a current flows from the storage layer 42 to the reference layer 44, that is, electrons traveling from the reference layer 44 to the storage layer 42 are supplied, electrons that are spin-polarized in the same direction as the magnetization direction of the reference layer 44 are injected into the storage layer 42. In this case, the magnetization direction of the storage layer 42 matches that of the reference layer 44. The magnetization direction of the reference layer 44 and that of the storage layer 42 thus attain a parallel alignment. In this parallel state, the resistance value of the variable resistive element R is minimized. This case will be defined as, for example, data "0".

On the other hand, as shown in FIG. 2C, when a current flows from the reference layer 44 to the storage layer 42, that is, electrons traveling from the storage layer 42 to the reference layer 44 are supplied, electrons that are reflected by the reference layer 44 and thus spin-polarized in a direction opposite to the magnetization direction of the reference layer 44 are injected into the storage layer 42. In this case, the magnetization direction of the storage layer 42 is reverse to that of the reference layer 44. The magnetization direction of the reference layer 44 and that of the storage layer 42 thus attain an antiparallel alignment. In this antiparallel state, the resistance value of the variable resistive element R is maximized. This case will be defined as, for example, data "1".

Data is read from the variable resistive element R in the following way.

A read current is supplied to the variable resistive element R. This read current is set to a value (a value smaller than a write current) that does not reverse the magnetization direction of the storage layer 42. A change in the resistance value of the variable resistive element R at this time is detected, thereby reading the data "0" and "1".

FIG. 3 is a circuit diagram showing part of FIG. 1 in more detail. More specifically, FIG. 3 shows details of the connection relationship between the bit lines BL, the source lines SL, and the read/write circuits 100. The connection relationship on the side of the memory cell array 110 is illustrated here. The connection relationship on the side of the memory cell array 210 is the same and is not illustrated.

As shown in FIG. 3, the read/write circuit 100 includes sense amplifiers SA1 and SA2 and write drivers WD1 and WD2. In the read operation, the sense amplifier SA1 applies a voltage to the bit line BL1 and the source line SL1, and the sense amplifier SA2 applies a voltage to the bit line BL2 and the source line SL2. On the other hand, in the write operation, the write driver WD1 applies a voltage to the bit line BL1 and the source line SL1, and the write driver WD2 applies a voltage to the bit line BL2 and the source line SL2.

The connection relationship between the sense amplifiers SA1 and SA2, the bit lines BL1 and BL2, and the source lines SL1 and S12 concerning the read operation will be described first.

The bit line BL1 is electrically connected to the first input terminal 100a of the sense amplifier SA1 via the current path of a transistor Tr11 having a gate electrically connected to a control line Read. In other words, one end of the current path of the transistor Tr11 is electrically connected to the bit line BL1, and the other end is electrically connected to the first input terminal 100a of the sense amplifier SA1. The bit line BL1 is also electrically connected to the control line VSS1 via the current path of a transistor Tr12 having a gate electrically connected to a control line P-Read. In other words, one end of the current path of the transistor Tr12 is electrically connected to the bit line BL1, and the other end is electrically connected to the control line VSS1.

The second portion SL1B of the source line SL1 is electrically connected to the first input terminal 100a of the sense amplifier SA1 via the current path of a transistor Tr13 having a gate electrically connected to the control line P-Read. In other words, one end of the current path of the transistor Tr13 is electrically connected to the second portion SL1B of the source line SL1, and the other end is electrically connected to the first input terminal 100a of the sense amplifier SA1. The second portion SL1B of the source line SL1 is also electrically connected to the control line VSS1 via the current path of the transistor Tr1 having a gate electrically connected to the control line Read. In other words, one end of the current path of the transistor Tr1 is electrically connected to the second portion SL1B of the source line SL1, and the other end is electrically connected to the control line VSS1.

On the other hand, the bit line BL2 is electrically connected to the first input terminal 100a of the sense amplifier SA2 via the current path of a transistor Tr14 having a gate electrically connected to the control line Read. In other words, one end of the current path of the transistor Tr14 is electrically connected to the bit line BL2, and the other end is electrically connected to the first input terminal 100a of the sense amplifier SA2. The bit line BL2 is also electrically connected to the first input terminal 100a of the sense amplifier SA2 via the current path of a transistor Tr15 having a gate electrically connected to a control line AP-Read. In other words, one end of the current path of the transistor Tr15 is electrically connected to the bit line BL2, and the other end is electrically connected to the first input terminal 100a of the sense amplifier SA2.

The second portion SL2B of the source line SL2 is electrically connected to the control line VSS1 via the current path of a transistor Tr16 having a gate electrically connected to the control line AP-Read. In other words, one end of the current path of the transistor Tr16 is electrically connected to the second portion SL2B of the source line SL2, and the other end is electrically connected to the control line VSS1. The second portion SL2B of the source line SL2 is also electrically connected to the control line VSS1 via the current path of the transistor Tr2 having a gate electrically connected to the control line Read. In other words, one end of the current path of the transistor Tr2 is electrically connected to the second portion SL2B of the source line SL2, and the other end is electrically connected to the control line VSS1.

The control lines VSS1, Read, AP-Read, and P-Read are controlled by the control circuit 300 shown in FIG. 1. The control line Read is set to H level in the read operation of the memory cell MC. The control line AP-Read is set to H level in the read operation of the reference cell RC in which AP state data is written. The control line P-Read is set to H level in the read operation of the reference cell RC in which P state data is written. Except for these operations, the control lines Read, AP-Read, and P-Read are set to L level.

The connection relationship between the write drivers WD1 and WD2, the bit lines BL1 and BL2, and the source lines SL1 and S12 concerning the write operation will be described next.

The bit line BL1 is electrically connected to the first input terminal 100a of the write driver WD1, and electrically connected to the power supply potential via the current path of a PMOS transistor PM2 in the write driver WD1. The bit line BL1 is also electrically connected to the ground potential via the current path of an NMOS transistor NM2 in the write driver WD1.

The second portion SL1B of the source line SL1 is electrically connected to the first input terminal 100a of the write driver WD1, and electrically connected to the power supply potential via the current path of a PMOS transistor PM1 in the write driver WD1. The second portion SL1B of the source line SL1 is also electrically connected to the ground potential via the current path of an NMOS transistor NM1 in the write driver WD1.

The bit line BL2 is electrically connected to the first input terminal 100a of the write driver WD2, and electrically connected to the power supply potential via the current path of a PMOS transistor PM4 in the write driver WD2. The bit line BL2 is also electrically connected to the ground potential via the current path of an NMOS transistor NM4 in the write driver WD2.

The second portion SL2B of the source line SL2 is electrically connected to the first input terminal 100a of the write driver WD2, and electrically connected to the power supply potential via the current path of a PMOS transistor PM3 in the write driver WD2. The second portion SL2B of the source line SL2 is also electrically connected to the ground potential via the current path of an NMOS transistor NM3 in the write driver WD2.

Note that the first portion SLA and the second portion SLB of each source line SL can be formed in the same layer or in different layers. When the first portion and the second portion are formed in the same layer, the third portion SLC is formed in the same layer, thereby connecting them. When the first portion and the second portion are formed in different layers, the third portion SLC is formed so as to extend in the stacking direction, thereby connecting them. When the first portion and the second portion are formed in different layers, the portion located on the upper side has a lower resistance. Hence, the total resistance of the source line SL can be decreased.

The source line SL and the bit line BL according to the first embodiment may be applied to a global source line and a global bit line, and a hierarchical structure also including a local source line and a local bit line may be formed.

[Write Operation of First Embodiment]

The write operation of the semiconductor memory device according to the first embodiment will be described with reference to FIG. 4. An example will be explained here in which "0" data (parallel state data) is written in the memory cell MC1.

Figure 4:
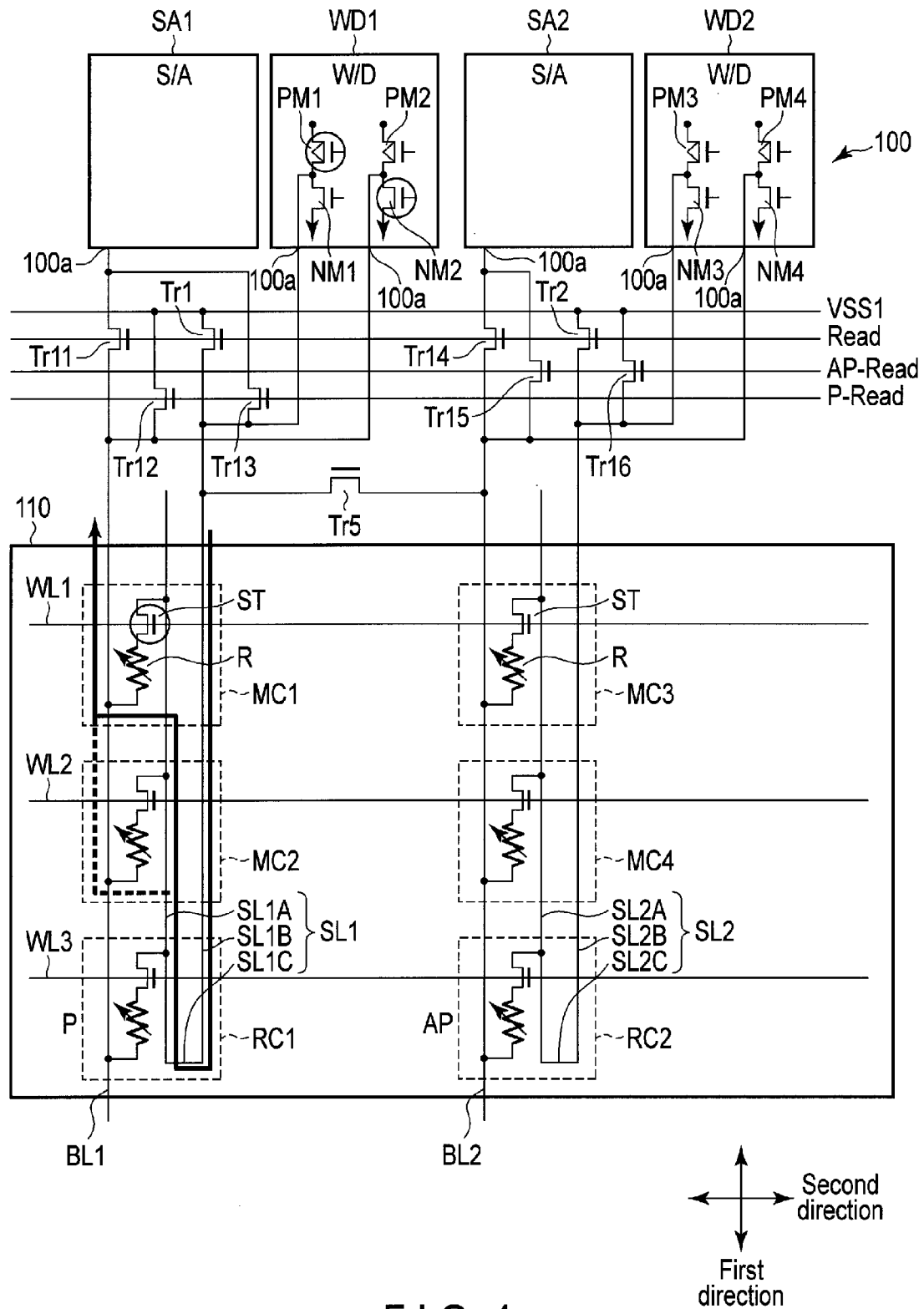
FIG. 4 is a circuit diagram showing the write operation of the semiconductor memory device according to the first embodiment.

FIG. 4 is a circuit diagram showing the write operation of the semiconductor memory device according to the first embodiment.

As shown in FIG. 4, in the write operation, the PMOS transistor PM1 and the NMOS transistor NM2 are turned on. The bit line BL1 is electrically connected to the ground potential, and the source line SL1 is electrically connected to the power supply potential. In addition, the word line WL1 is set to H level, thereby turning on the select transistor ST of the memory cell MC1. A write current path is thus formed in which a write current flows from the power supply potential to the ground potential sequentially via the source line SL1 and the bit line BL1.

More specifically, the write current flows from the power supply potential into the ground potential sequentially via the second portion SL1B, the third portion SL1C, and the first portion SL1A of the source line SL1, the memory cell MC1, and the bit line BL1. When the current is supplied to the memory cell MC1 (variable resistive element R) from the side of the source line SL1 to the side of the bit line BL1, "0" data is written in the memory cell MC1.

As indicated by the broken line in FIG. 4, when writing "0" data in the memory cell MC2, the write current flows from the power supply potential into the ground potential sequentially via the second portion SL1B, the third portion SL1C, and the first portion SL1A of the source line SL1, the memory cell MC2, and the bit line BL1. As shown in FIG. 4, the write current path of the memory cell MC1 and that of the memory cell MC2 have the same length. This makes it possible to eliminate the dependence of the write current path on the position of the memory cell MC in write control.

Note that in this example, a setting is done to write "0" data (parallel state data) by supplying a current to the memory cell NC from the side of the source line SL to the side of the bit line BL and write "1" data (antiparallel state data) by supplying a current to the memory cell MC from the side of the bit line BL to the side of the source line SL. However, the setting can appropriately be changed.

[Read Operation of First Embodiment]

The read operation of the semiconductor memory device according to the first embodiment will be described with reference to FIGS. 5 and 6.

FIG. 5 is a circuit diagram showing the memory cells MC in the read operation of the semiconductor memory device according to the first embodiment. FIG. 6 is a circuit diagram showing the reference cells RC in the read operation of the semiconductor memory device according to the first embodiment.

An example will be explained here in which data stored in the memory cells MC1 and MC3 of the memory cell array 110 shown in FIG. 5 are read using the reference cells RC3 and RC4 of the memory cell array 210 shown in FIG. 6. Reading data stored in the memory cells MC5 and MC7 of the memory cell array 210 shown in FIG. 6 using the reference cells RC1 and RC2 of the memory cell array 110 shown in FIG. 5 can also be performed by the same operation.

Note that the connection relationship between the memory cell array 210 and the read/write circuit 100 shown in FIG. 6 is the same as the connection relationship between the memory cell array 110 and the read/write circuit 100 shown in FIG. 3 (FIG. 5). Transistors Tr21, Tr22, Tr23, Tr24, Tr25, and Tr26 correspond to the transistors Tr11, Tr12, Tr13, Tr14, Tr15, and Tr16, respectively.

As shown in FIG. 5, on the side of the memory cell array 110 (memory cells MC) in the read operation, the control line Read is set to H level, thereby turning on the transistors Tr11 and Tr1. The bit line BL1 is electrically connected to the first input terminal 100a of the sense amplifier SA1, and the source line SL1 is electrically connected to the control line VSS1. In addition, the word line WL1 is set to H level, thereby turning on the select transistor ST of the memory cell MC1. A read current path is thus formed in which a read current flows from the sense amplifier SA1 to the control line VSS2 sequentially via the bit line BL1 and the source line SL1.

In addition, the control line Read is set to H level, thereby turning on the transistors Tr14 and Tr2. The bit line BL2 is electrically connected to the first input terminal 100a of the sense amplifier SA2, and the source line SL2 is electrically connected to the control line VSS1. In addition, the word line WL1 is set to H level, thereby turning on the select transistor ST of the memory cell MC3. A read current path is thus formed in which a read current flows from the sense amplifier SA1 to the control line VSS1 sequentially via the bit line BL1 and the source line SL1.

As shown in FIG. 6, on the side of the memory cell array 210 (reference cells RC) in the read operation, the control line P-Read is set to H level, thereby turning on the transistors Tr22 and Tr23. The bit line BL3 is electrically connected to the control line VSS2, and the source line SL3 is electrically connected to the second input terminal 100b of the sense amplifier SA1. In addition, the word line WL6 is set to H level, thereby turning on the select transistor ST of the reference cell RC3. A read current path is thus formed in which a read current flows from the sense amplifier SA1 to the control line VSS2 sequentially via the source line SL3 and the bit line BL3.

In addition, the control line AP-Read is set to H level, thereby turning on the transistors Tr25 and Tr26. The bit line BL3 is electrically connected to the second input terminal 100*b* of the sense amplifier SA2, and the source line SL3 is electrically connected to the control line VSS2. In addition, the word line WL6 is set to H level, thereby turning on the select transistor ST of the reference cell RC4. A read current path is thus formed in which a read current flows from the sense amplifier SA2 to the control line VSS2 sequentially via the bit line BL4 and the source line SL4.

As described above, the direction in which the read current flows can appropriately be changed in accordance with the data written in the reference cell RC. This makes it possible to avoid a read disturb in which the data of the reference cell RC is rewritten by the read current.

When the transistor Tr6 is turned on, the bit line BL4 and the second portion SL3B of the source line SL3 are set to an equipotential. The second input terminal 100*b* of the sense amplifier SA1 and the second input terminal 100*b* of the sense amplifier SA2 are thus set to an intermediate level between an input voltage for a low resistance state corresponding to the P state of the reference cell RC3 and an input voltage for a high resistance state corresponding to the AP state of the reference cell RC4.

The sense amplifier SA1 compares the current flowing to the first input terminal 100*a* shown in FIG. 5 and the current flowing to the second input terminal 100*b* shown in FIG. 6, and outputs a read signal corresponding to the comparison result. A logical value ("0" or "1") stored in the memory cell MC1 is determined based on the read signal.

The sense amplifier SA2 compares the current flowing to the first input terminal 100*a* shown in FIG. 5 and the current flowing to the second input terminal 100*b* shown in FIG. 6, and outputs a read signal corresponding to the comparison result. A logical value ("0" or "1") stored in the memory cell MC2 is determined based on the read signal.

[Effects of First Embodiment]

According to the first embodiment, the source line SL has a U-shaped structure formed from the first portion SLA and the second portion SLB which extend in the first direction, and the third portion SLC that connects the one-end sides of them. With this arrangement, the control line VSS that is a current sink in a read current path can be arranged on the side of the read/write circuit 100. It is therefore possible to obtain the following effects.

FIG. 7 is a circuit diagram showing the write operation of a semiconductor memory device according to a comparative example.

As shown in FIG. 7, in the comparative example, the control line VSS is arranged on a side opposite to the read/write circuit 100 with respect to the memory cell array 110 (the bit line BL and the source line SL). Each source line SL has no folded structure but one linear structure. In this case, the write current path of the memory cell MC2 is longer than that of the memory cell MC1. For this reason, the resistance of the write current path changes depending on the position of the write target memory cell MC. When the write current path depends on the position of the write target memory cell MC, write current control according to the write target memory cell MC is difficult.

In the first embodiment shown in FIG. 4, however, the source line SL1 has a folded structure (U-shaped structure) formed from the first portion SL1A, the second portion SL1B, and the third portion SL1C. Hence, the write current path of the memory cell MC1 and that of the memory cell MC2 can have the same length. That is, it is possible to eliminate the dependence of the write current path on the position of the memory cell MC and improve the reliability.

Figure 8:
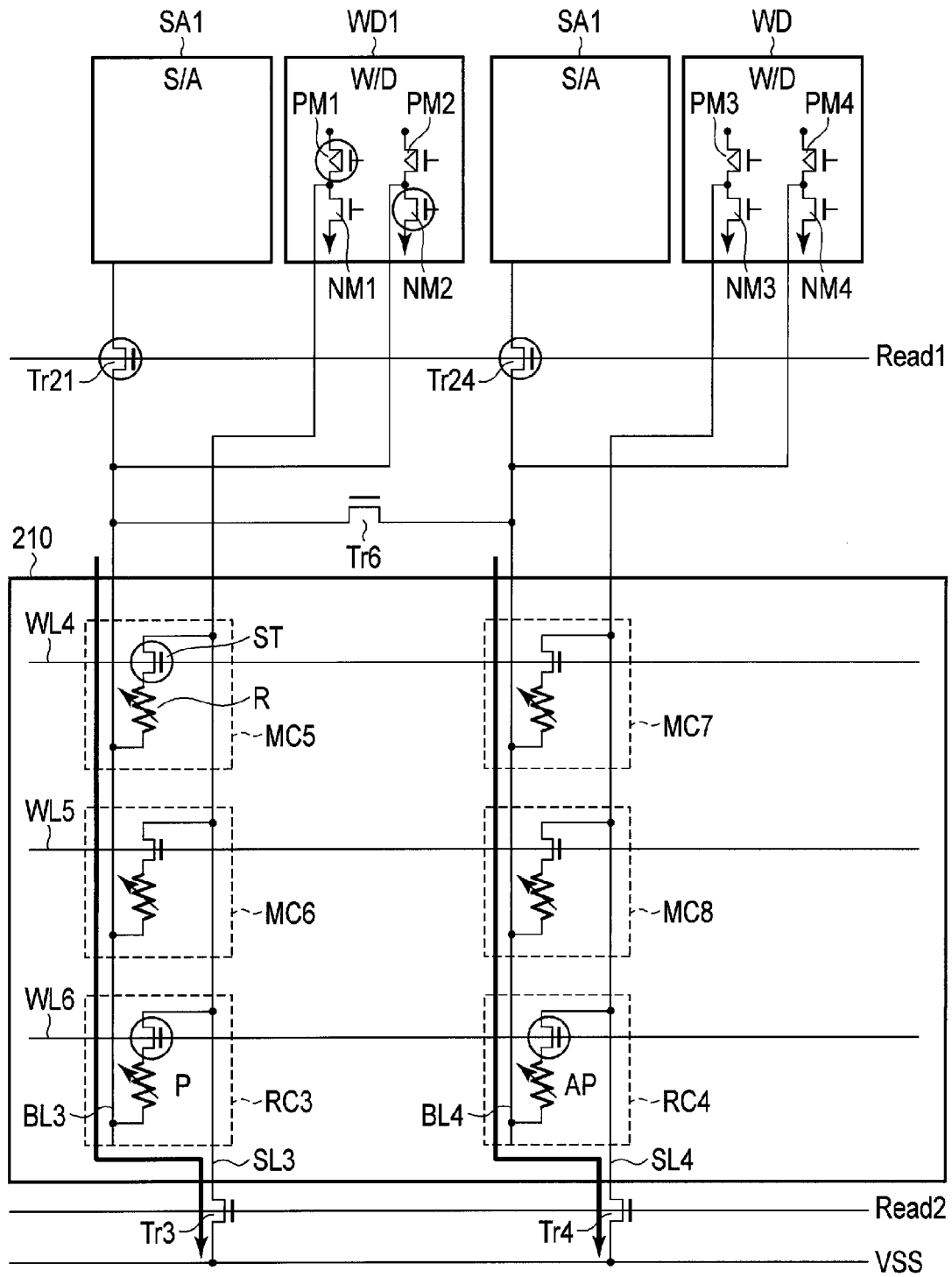
FIG. 8 is a circuit diagram showing reference cells in the read operation of the semiconductor memory device according to the comparative example.

FIG. 8 is a circuit diagram showing reference cells RC in the read operation of the semiconductor memory device according to the comparative example.

As shown in FIG. 8, in the comparative example, the read current path of the reference cell RC3 and that of the reference cell RC4 cause the read currents to flow in the same direction (the direction from the bit line BL to the source line SL). For this reason, the read current flows to one of the reference cells RC in a direction to write data opposite to the stored data. In this example, the read current flows, to the reference cell RC4 in which AP state data is written, in a direction to write P state data. Hence, a read disturb may occur in the reference cell RC4, in which the data is rewritten by the read current.

In the first embodiment shown in FIG. 6, however, the direction in which the read current flows can appropriately be changed. More specifically, the direction of the read current flowing to the reference cell RC3 in which P state data is written is the same as the direction to write P state data (the direction from the source line SL3 to the bit line BL3). It is therefore possible to avoid a read disturb in which the data of the reference cell RC3 is rewritten by the read current. In addition, the direction of the read current flowing to the reference cell RC4 in which AP state data is written is the same as the direction to write AP state data (the direction from the bit line BL3 to the source line SL3). It is therefore possible to avoid a read disturb in which the data of the reference cell RC3 is rewritten by the read current.

Furthermore, in the first embodiment, a dispersion of control systems can be prevented by arranging (concentrating) the control lines VSS on the side of the read/write circuit 100. It is therefore possible to implement an efficient circuit arrangement and reduce the circuit area.

Second Embodiment

A semiconductor memory device according to the second embodiment will be described below with reference to FIGS. 9 and 10. In the second embodiment, a capacitor C is connected between a control line VSS and a control line VCLAMP electrically connected to the gate of a clamp transistor Tr31 configured to control a read current in a sense amplifier SA. This can prevent a decrease in the read margin caused by GND noise (noise to the control line VSS). The second embodiment will be described below in detail.

Note that in the second embodiment, a description of the same points as in the first embodiment will be omitted, and different points will mainly be described.

[Arrangement of Second Embodiment]

The arrangement of the semiconductor memory device according to the second embodiment will be described with reference to FIGS. 9 and 10.

Figure 9:
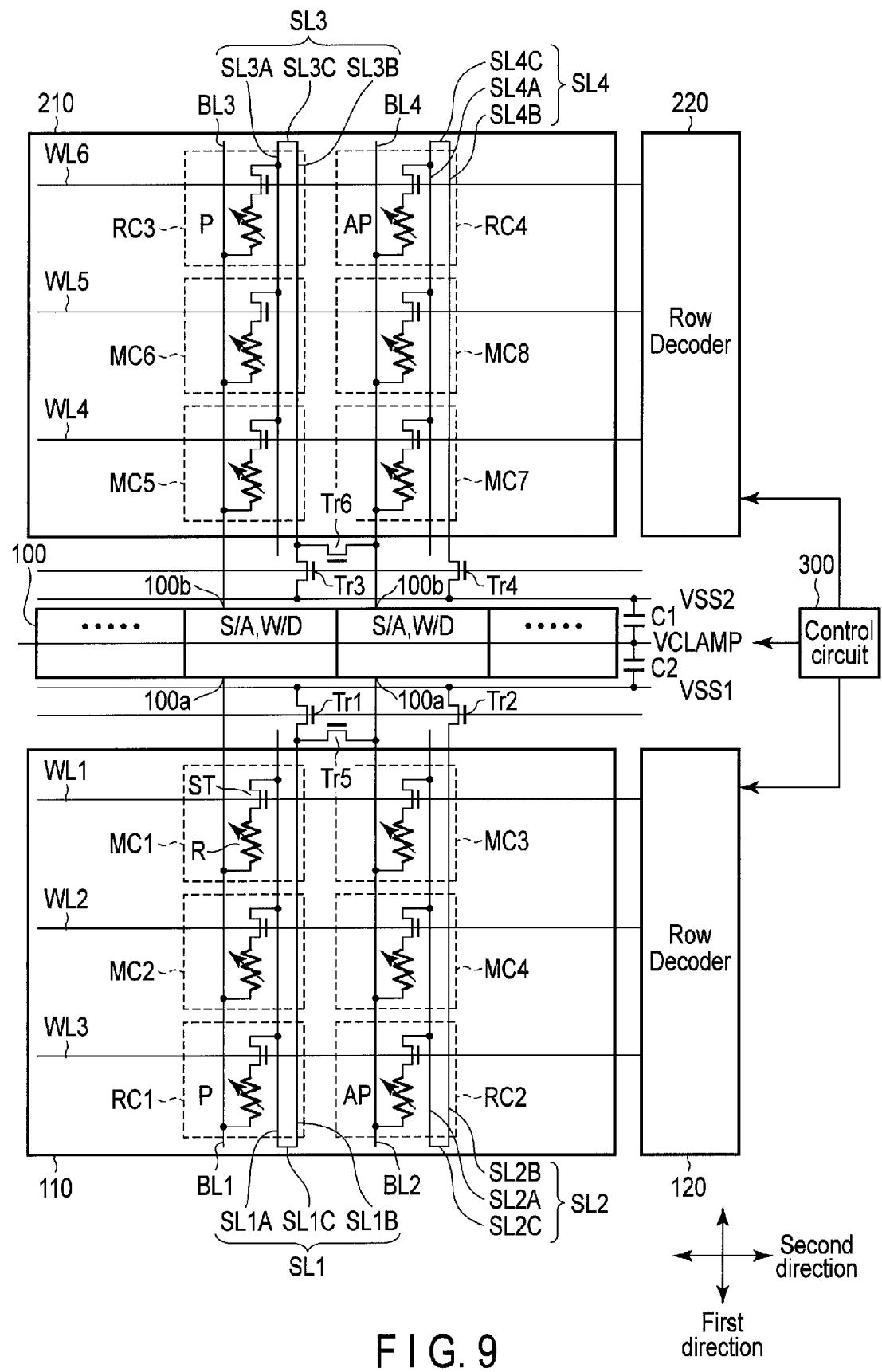
FIG. 9 is a circuit diagram showing the arrangement of a semiconductor memory device according to the second embodiment.

FIG. 9 is a circuit diagram showing the arrangement of a semiconductor memory device according to the second embodiment. FIG. 10 is a circuit diagram showing part of FIG. 9 in more detail. More specifically, FIG. 10 shows details of the connection relationship between bit lines BL, source lines SL, and a read/write circuits 100.

As shown in FIG. 9, the second embodiment is different from the first embodiment in that the capacitors C (C1 and C2) are electrically connected between the control line VCLAMP and the control lines VSS (VSS1 and VSS2).

Figure 10:
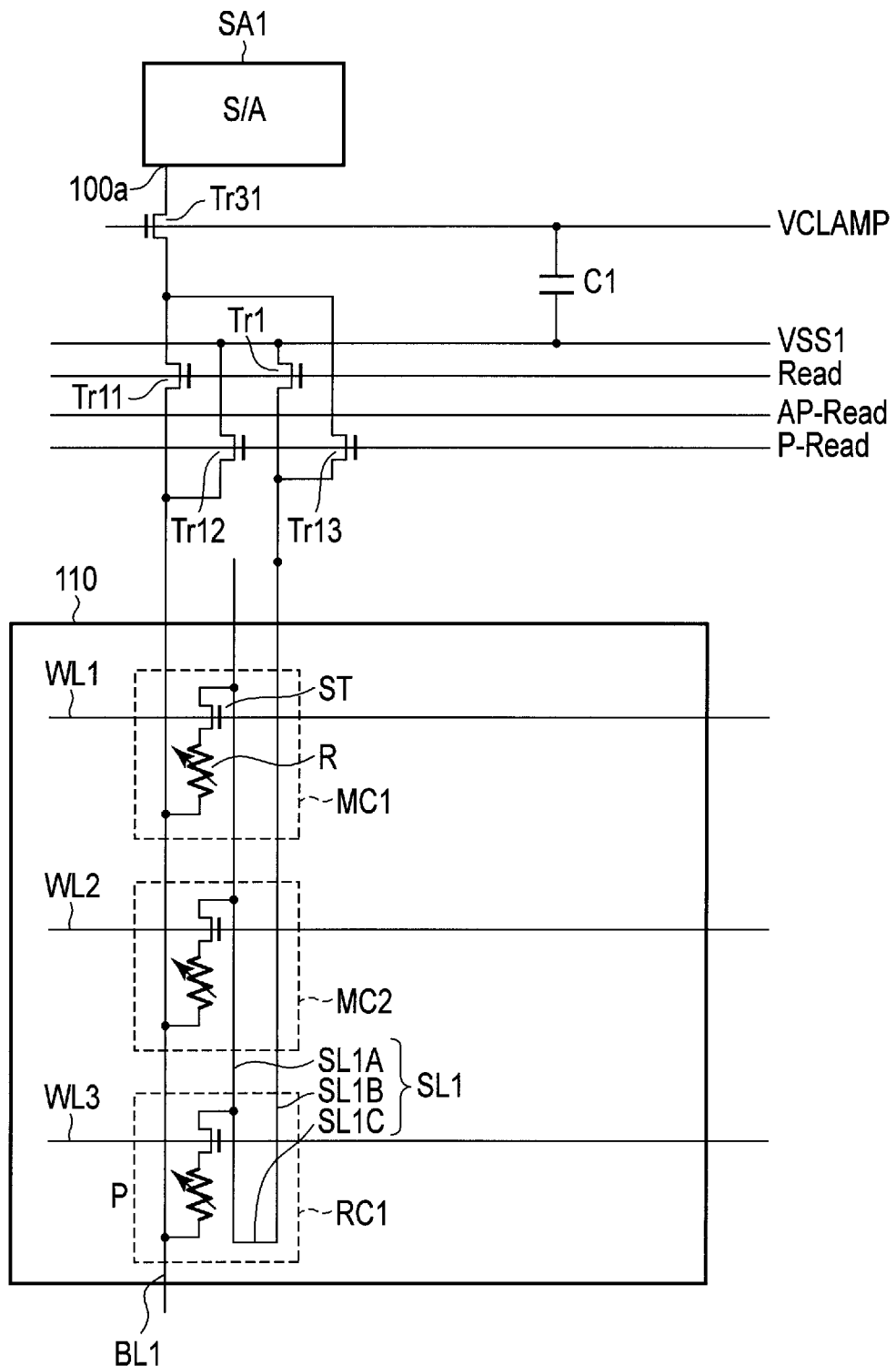
FIG. 10 is a circuit diagram showing part of FIG. 9 in more detail.

As shown in FIG. 10, the clamp transistor Tr31 has a gate electrically connected to the control line VCLAMP (read current control line), and controls the read current in a sense amplifier SA1. The current path of the clamp transistor Tr31 is arranged between a transistor Tr11 and a first input terminal 100a of the sense amplifier SA1 and between a transistor Tr13 and the first input terminal 100a of the sense amplifier SA1. That is, one end of the current path of the clamp transistor Tr31 is electrically connected to the other terminal of the transistor Tr11 and the other terminal of the transistor Tr13, and the other end is electrically connected to the first input terminal 100a of the sense amplifier SA1. Note that the clamp transistor Tr31 may be formed as part of the sense amplifier SA.

The capacitor C1 is arranged between the control line VCLAMP and the control line VSS1. This can prevent a decrease in the read margin caused by GND noise (noise to the control line VSS1).

[Effects of Second Embodiment]

According to the second embodiment, the capacitor C is connected between the control line VSS and the control line VCLAMP electrically connected to the gate of the clamp transistor Tr31. It is therefore possible to obtain the following effects.

A cause of a decrease in the read margin, that is, a decrease in the read current, is GND noise (noise to the control line VSS1). The magnitude of the read current is determined by the voltage difference between the control line VSS1 and one terminal (the connection terminal to the bit line BL or the source line SL) of the clamp transistor Tr31. In addition, the voltage of one terminal of the clamp transistor Tr31 is determined by the size of the control line VCLAMP. At this time, the voltage of the control line VSS1 may instantaneously rise due to GND noise, for example, IR drop by the read current. For this reason, the voltage difference between the control line VSS1 and one terminal of the clamp transistor Tr31 becomes small, and as a result, the read current decreases.

In the present application, however, the capacitor C is arranged between the control line VCLAMP and the control line VSS1. With this arrangement, even when the voltage of the control line VSS1 rises, the voltage of the control line VCLAMP can similarly be raised. In other words, the voltage rise by GND noise is reflected on the control line VCLAMP as well, thereby canceling the voltage rise of the control line VSS1. It is therefore possible to prevent a decrease in the voltage difference between the control line VSS1 and one terminal of the clamp transistor Tr31 caused by the GND noise and prevent a decrease in the read current, that is, a decrease in the read margin.

Third Embodiment

A semiconductor memory device according to the third embodiment will be described below with reference to FIG. 11. In the third embodiment, the side of a memory cell array 110 and the side of a memory cell array 210 share a control line VSS that is a current sink in a read current path. This makes it possible to connect memory cells MC and reference cells RC to the same control line VSS, facilitate control of the read operation, and improve the reliability. The third embodiment will be described below in detail.

Note that in the third embodiment, a description of the same points as in the first embodiment will be omitted, and different points will mainly be described.

[Arrangement of Third Embodiment]

The arrangement of the semiconductor memory device according to the third embodiment will be described with reference to FIG. 11.

FIG. 11 is a circuit diagram showing the arrangement of a semiconductor memory device according to the third embodiment.

As shown in FIG. 11, the third embodiment is different from the first embodiment in that the side of the memory cell array 110 and the side of the memory cell array 210 share the control line VSS that is a current sink in a read current path.

The control line VSS is electrically connected to a second portion SL1B of a source line SL1 via the current path of a transistor Tr1 and to a second portion SL2B of a source line SL2 via the current path of a transistor Tr2, and also electrically connected to a second portion SL3B of a source line SL3 via the current path of a transistor Tr3 and to a second portion SL4B of a source line SL4 via the current path of a transistor Tr4.

Although not illustrated, the control line VSS is electrically connected to a bit line BL1 via the current path of a transistor Tr12 and to a bit line BL3 via the current path of a transistor Tr22.

At this time, the control line VSS is preferably located at the intermediate position between the memory cell array 110 and the memory cell array 210. For this purpose, the control line VSS is preferably arranged in the formation region of a read/write circuit 100.

[Effects of Third Embodiment]

According to the third embodiment, the side of the memory cell array 110 and the side of the memory cell array 210 share the control line VSS that is a current sink in a read current path. That is, in the read operation, the memory cells MC in the memory cell array 110 and the reference cells RC in the memory cell array 210 can be connected to the same control line VSS. With this arrangement, the same control line VSS can be connected to any read current path, and the memory cells MC and the reference cells RC can share the influence of GND noise or the like as well. This makes it possible to facilitate control of the read operation and improve the reliability.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first bit line extending in a first direction;
   a first source line including a first portion that is adjacent to the first bit line and extends in the first direction, a second portion that is adjacent to the first portion and extends in the first direction, and a third portion that connects one end of the first portion and one end of the second portion;
   a first word line that extends in a second direction crossing with the first direction and is crossing with the first bit line and the first source line;
   a first memory cell formed from a variable resistive element and a select transistor having a gate electrically connected to the first word line, the first memory cell having one terminal electrically connected to the first bit line and the other terminal electrically connected to the first portion of the first source line;

a first sense amplifier arranged on the other end side of the first portion and the second portion of the first source line; and a first current sink arranged between the first sense amplifier and the first memory cell, wherein in a read operation, one end of the first bit line is electrically connected to a first input terminal of the first sense amplifier, and the other end of the second portion of the first source line is electrically connected to the first current sink.

2. The device of claim 1, further comprising:

a first transistor whose current path has one end electrically connected to the one end of the first bit line and the other end electrically connected to the first input terminal of the first sense amplifier, and whose gate is electrically connected to a first control line; and a second transistor whose current path has one end electrically connected to the other end of the second portion of the first source line and the other end electrically connected to the first current sink, and whose gate is electrically connected to the first control line.

3. The device of claim 1, further comprising:

a second bit line arranged on the other side of the first bit line with respect to the first sense amplifier and extending in the first direction;

a second source line including a first portion that is adjacent to the second bit line and extends in the first direction, a second portion that is adjacent to the first portion and extends in the first direction, and a third portion that connects one end of the first portion and one end of the second portion;

a second word line that extends in the second direction and is crossing with the second bit line and the second source line;

a first reference cell formed from a variable resistive element and a select transistor having a gate electrically connected to the second word line and, the first reference cell having one terminal electrically connected to the second bit line and the other terminal electrically connected to the first portion of the third source line, the first reference cell in which a first logical value is written; and a second current sink arranged between the first sense amplifier and the first reference cell, wherein in the read operation, one end of the second bit line is electrically connected to one of the second current sink and a second input terminal of the first sense amplifier, and the other end of the second portion of the second source line is electrically connected to the other of the second current sink and the second input terminal of the first sense amplifier.

4. The device of claim 3, wherein in the read operation, a read current flows to the first reference cell in a direction to write the first logical value.

5. The device of claim 3, further comprising:

a third transistor whose current path has one end electrically connected to the one end of the second bit line and the other end electrically connected to one of the second current sink and the second input terminal of the first sense amplifier, and whose gate is electrically connected to a second control line; and a fourth transistor whose current path has one end electrically connected to the other end of the second portion of the second source line and the other end electrically connected to the other of the second current sink and the second input terminal of the first sense amplifier, and whose gate is electrically connected to the second control line.

6. The device of claim 3, further comprising:

a third bit line that is adjacent to the second portion of the first source line and extends in the first direction;

a third source line including a first portion that is adjacent to the third bit line and extends in the first direction, a second portion that is adjacent to the first portion and extends in the first direction, and a third portion that connects one end of the first portion and one end of the second portion;

a second memory cell formed from a variable resistive element and a select transistor having a gate electrically connected to the first word line, the second memory cell having one terminal electrically connected to the third bit line and the other terminal electrically connected to the first portion of the third source line;

a second sense amplifier that is arranged on the other end side of the first portion and the second portion of the third source line and is adjacent to the first sense amplifier; a fourth bit line that is adjacent to the second portion of the second source line and extends in the first direction;

a fourth source line including a first portion that is adjacent to the fourth bit line and extends in the first direction, a second portion that is adjacent to the first portion and extends in the first direction, and a third portion that connects one end of the first portion and one end of the second portion; and a second reference cell formed from a variable resistive element and a select transistor having a gate electrically connected to the second word line, the second reference cell having one terminal electrically connected to the fourth bit line and the other terminal electrically connected to the first portion of the fourth source line, the second reference cell in which a second logical value is written, wherein in the read operation, one end of the third bit line is electrically connected to the first input terminal of the second sense amplifier, and the other end of the second portion of the third source line is electrically connected to the first current sink, and one end of the fourth bit line is electrically connected to the other of the second current sink and the second input terminal of the second sense amplifier, and the other end of the second portion of the fourth source line is electrically connected to one of the second current sink and the second input terminal of the second sense amplifier.

7. The device of claim 6, wherein in the read operation, a read current flows to the second reference cell in a direction to write the second logical value.

8. The device of claim 6, wherein in the read operation, the second input terminal of the first sense amplifier and the second input terminal of the second sense amplifier are electrically connected.

9. The device of claim 1, further comprising:

a third transistor whose current path has one end electrically connected to the one end of the first bit line and the other end electrically connected to the first input terminal of the first sense amplifier, and whose gate is electrically connected to a third control line; and a capacitor electrically connected between the third control line and the first current sink.

10. The device of claim 3, wherein the first current sink and the second current sink are the same control line.

11. The device of claim 1, further comprising a write driver arranged on the other end side of the first portion and the second portion of the first source line and having a power supply potential and a ground potential, wherein in a write operation, the one end of the first bit line is electrically connected to one of the power supply potential and the ground potential of the write driver, and the other end of the second portion of the first source line is electrically connected to the other of the power supply potential and the ground potential of the write driver.

12. A semiconductor memory device comprising:
a first bit line extending in a first direction;
a first source line including a first portion that is adjacent to the first bit line and extends in the first direction, a second portion that is adjacent to the first portion and extends in the first direction, and a third portion that connects one end of the first portion and one end of the second portion;
a first word line that extends in a second direction crossing with the first direction and is crossing with the first bit line and the first source line;
a first memory cell formed from a variable resistive element and a select transistor having a gate electrically connected to the first word line, the first memory cell having one terminal electrically connected to the first bit line and the other terminal electrically connected to the first portion of the first source line; and
a write driver arranged on the other end side of the first portion and the second portion of the first source line and having a power supply potential and a ground potential,
wherein in a write operation, one end of the first bit line is electrically connected to one of the power supply potential and the ground potential of the write driver, and the other end of the second portion of the first source line is electrically connected to the other of the power supply potential and the ground potential of the write driver.

13. The device of claim 12, further comprising:
a second word line that is adjacent to the first word line, extends in the second direction, and is crossing with the first bit line and the first source line; and
a second memory cell formed from a variable resistive element and a select transistor having a gate electrically connected to the second word line, the second memory cell having one terminal electrically connected to the first bit line and the other terminal electrically connected to the first portion of the first source line,
wherein a length of a write current path of the first memory cell equals the length of the write current path of the second memory cell.

14. A semiconductor memory device comprising:
a first bit line extending in a first direction;
a first source line including a first portion that is adjacent to the first bit line and extends in the first direction, a second portion that is adjacent to the first portion and extends in the first direction, and a third portion that connects one end of the first portion and one end of the second portion;
a first word line that extends in a second direction crossing with the first direction and is crossing with the first bit line and the first source line;
a first memory cell formed from a variable resistive element and a select transistor having a gate electrically connected to the first word line, the first memory cell having one terminal electrically connected to the first bit line and the other terminal electrically connected to the first portion of the first source line;
a first read/write circuit arranged on the other end side of the first portion and the second portion of the first source line and including a first sense amplifier and a first write driver; and
a first current sink arranged between the first read/write circuit and the first memory cell.

15. The device of claim 14, further comprising:
a first transistor whose current path has one end electrically connected to the one end of the first bit line and the other end electrically connected to a first input terminal of the first sense amplifier, and whose gate is electrically connected to a first control line; and
a second transistor whose current path has one end electrically connected to the other end of the second portion of the first source line and the other end electrically connected to the first current sink, and whose gate is electrically connected to the first control line.

16. The device of claim 14, further comprising:
a second bit line arranged on the other side of the first bit line with respect to the first read/write circuit and extending in the first direction;
a second source line including a first portion that is adjacent to the second bit line and extends in the first direction, a second portion that is adjacent to the first portion and extends in the first direction, and a third portion that connects one end of the first portion and one end of the second portion;
a second word line that extends in the second direction and is crossing with the second bit line and the second source line;
a first reference cell formed from a variable resistive element and a select transistor having a gate electrically connected to the second word line, the first reference cell having one terminal electrically connected to the second bit line and the other terminal electrically connected to the first portion of the third source line, the first reference cell in which a first logical value is written; and
a second current sink arranged between the first read/write circuit and the first reference cell.

17. The device of claim 16, further comprising:
a third transistor whose current path has one end electrically connected to the one end of the second bit line and the other end electrically connected to one of the second current sink and a second input terminal of the first sense amplifier, and whose gate is electrically connected to a second control line; and
a fourth transistor whose current path has one end electrically connected to the other end of the second portion of the second source line and the other end electrically connected to the other of the second current sink and the second input terminal of the first sense amplifier, and whose gate is electrically connected to the second control line.

18. The device of claim 16, further comprising:
a third bit line that is adjacent to the second portion of the first source line and extends in the first direction;
a third source line including a first portion that is adjacent to the third bit line and extends in the first direction, a second portion that is adjacent to the first portion and extends in the first direction, and a third portion that connects one end of the first portion and one end of the second portion;
a second memory cell formed from a variable resistive element and a select transistor having a gate electrically connected to the first word line, the second memory cell having one terminal electrically connected to the third bit line and the other terminal electrically connected to the first portion of the third source line;
a second read/write circuit that is arranged on the other end side of the first portion and the second portion of the third source line, is adjacent to the first read/write circuit, and includes a second sense amplifier and a second write driver;
a fourth bit line that is adjacent to the second portion of the second source line and extends in the first direction;
a fourth source line including a first portion that is adjacent to the fourth bit line and extends in the first direction, a second portion that is adjacent to the first portion and extends in the first direction, and a third portion that connects one end of the first portion and one end of the second portion; and
a second reference cell formed from a variable resistive element and a select transistor having a gate electrically connected to the second word line, the second reference cell having one terminal electrically connected to the fourth bit line and the other terminal electrically connected to the first portion of the fourth source line, the second reference cell in which a second logical value is written.

19. The device of claim 14, further comprising:
a third transistor whose current path has one end electrically connected to the one end of the first bit line and the other end electrically connected to a first input terminal of the first sense amplifier, and whose gate is electrically connected to a second control line; and
a capacitor electrically connected between the second control line and the first current sink.

20. The device of claim 16, wherein the first current sink and the second current sink are the same control line.

* * * * *